(12) United States Patent
Lee

(10) Patent No.: US 7,582,548 B2
(45) Date of Patent: Sep. 1, 2009

(54) SEMICONDUCTOR DEVICE AND MANUFACTURING METHOD THEREOF

(75) Inventor: Sang Bum Lee, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/481,103

(22) Filed: Jul. 5, 2006

(65) Prior Publication Data
US 2007/0007550 A1    Jan. 11, 2007

(30) Foreign Application Priority Data
Jul. 5, 2005    (KR) .................. 10-2005-0060332

(51) Int. Cl.
*H01L 21/3205* (2006.01)

(52) U.S. Cl. .................. 438/587; 438/596; 257/202; 257/E27

(58) Field of Classification Search .................. None
See application file for complete search history.

(56) References Cited

U.S. PATENT DOCUMENTS

| | | | |
|---|---|---|---|
| 6,384,450 B1 * | 5/2002 | Hidaka et al. | 257/321 |
| 6,870,230 B2 * | 3/2005 | Matsuda et al. | 257/365 |
| 6,930,743 B2 * | 8/2005 | Park et al. | 349/149 |
| 2005/0167762 A1 * | 8/2005 | Kadoshima et al. | 257/392 |

* cited by examiner

*Primary Examiner*—Sue Purvis
*Assistant Examiner*—Fei Fei Yeung Lopez
(74) *Attorney, Agent, or Firm*—Saliwanchik, Lloyd & Saliwanchik

(57) ABSTRACT

A semiconductor device is provided. The semiconductor device includes a first gate line, a second gate line, a first contact electrode, first dummy gates, a second gate pad, and a second contact electrode. The first gate line is formed on a semiconductor substrate and the second gate line of a spacer shape is formed on the sidewalls of the first gate line with a thin insulating layer interposed therebetween. The first contact electrode is vertically connected with the first gate line. The first dummy gates are formed in array spaced a predetermined interval from the first gate line on the semiconductor substrate. The second gate pad of a spacer shape is formed on the sidewalls of the first dummy gates with a thin insulating layer interposed therebetween. The second gate pad is connected to the second gate line and is also gap-filled between the first dummy gates. The second contact electrode is vertically connected with the second gate pad.

13 Claims, 4 Drawing Sheets

US 7,582,548 B2

SEMICONDUCTOR DEVICE AND MANUFACTURING METHOD THEREOF

RELATED APPLICATION

This application claims the benefit, under 35 U.S.C. § 119(e), of Korean Patent Application Number 10-2005-060332 filed Jul. 5, 2005, which is incorporated herein by reference in its entirety.

FIELD OF THE INVENTION

The present invention relates to a semiconductor device and a method of manufacturing a semiconductor device, and more particularly, to a semiconductor device and a manufacturing method thereof, capable of reducing a gate line critical dimension (CD) of a highly integrated semiconductor device.

BACKGROUND OF THE INVENTION

Generally, a transistor of a metal-oxide-semiconductor (MOS) structure includes a gate electrode (hereinafter, referred to as "gate line") formed in a line shape on a semiconductor substrate such as a silicon substrate, and source/drain regions formed by doping portions of the semiconductor substrate that are exposed at both sides of the gate line with n-type or p-type impurities. A linewidth of the gate electrode is determined according to a design rule. As semiconductor devices become highly integrated, the linewidth of the gate electrode reduces.

According to a method of manufacturing a gate line contact of a semiconductor device of a prior art, a device isolation layer is formed on a silicon substrate by a shallow trench isolation (STI) process to isolate an active region from an inactive region. Next, a plurality of gate lines are formed on the substrate, and a spacer formed of an insulating material (for example, a silicon nitride layer) is formed on both sidewalls of the gate line. Conductive impurities are then ion-implanted into the substrate to form source/drain regions. Next, an interlayer insulating layer is formed on the entire surface of the substrate, and a contact electrode connected with the gate line or the source/drain regions is formed in the interlayer insulating layer. Then, a line connected with the contact electrode is formed on the interlayer insulating layer.

The above method is commonly used for manufacturing a memory device such as a dynamic random access memory (DRAM) device, where transistors having the above-described MOS structure are arranged in a matrix form. Referring to FIG. 1, the device includes a contact electrode 30 connected with a gate line 20 and formed in a peripheral circuit region 40. The contact electrode 30 is vertically connected with a power source line for providing a predetermined voltage to the gate line 20 formed in a cell array region 10.

However, as the semiconductor device becomes highly integrated, a memory device having a plurality of gate lines has a limitation in reducing a linewidth of a gate line formed on a surface of a substrate of the memory device. Accordingly, a method is under development to reduce a linewidth of the gate line by forming a secondary gate line of a spacer shape with a thin insulating layer interposed on sidewalls of the gate line on the substrate. Therefore, power supply to the secondary gate line becomes an issue.

SUMMARY OF THE INVENTION

Accordingly, the present invention is directed to a semiconductor device and a manufacturing method thereof that addresses and/or substantially obviates one or more problems, limitations, and/or disadvantages of the prior art.

An object of the present invention is to provide a semiconductor device that can provide a sufficient voltage even to a spacer shaped gate line with a reduced critical dimension.

Another object of the present invention is to provide a method of manufacturing a semiconductor device that can provide a sufficient voltage even to a spacer shaped gate line with a reduced critical dimension.

Additional advantages, objects, and features of the invention will be set forth in part in the description which follows and in part will become apparent to those having ordinary skill in the art upon examination of the following or can be learned from practice of the invention. The objectives and other advantages of the invention can be realized and attained by the structure particularly pointed out in the written description and claims hereof as well as the appended drawings.

To achieve these objects and other advantages and in accordance with the purpose of the invention, as embodied and broadly described herein, there is provided a semiconductor device incorporating: a first gate line formed on a semiconductor substrate; a second gate line of a spacer shape formed on the sidewalls of the first gate line with a thin insulating layer interposed therebetween; a first contact electrode vertically connected with the first gate line; an array of first dummy gates spaced a predetermined interval from the first gate line and formed on the semiconductor substrate; a second gate pad of a spacer shape formed on the sidewalls of the first dummy gates with a thin insulating layer interposed therebetween, the second gate pad being connected with the second gate line and gap-filled between the first dummy gates; and a second contact electrode vertically connected with the second gate pad.

In another aspect of the present invention, there is provided a method of manufacturing a semiconductor device including: forming a first gate line and an array of first dummy gates spaced a predetermined interval from the first gate line on a semiconductor substrate; forming a thin insulating layer on the sidewalls of the first gate line and each of the first dummy gates; forming a second gate line of a spacer shape on the thin insulating layer on the sidewalls of the first gate line and forming a second gate pad of a spacer shape on the thin insulating layer on the sidewalls of the first dummy gates, where the second gate pad is connected with the second gate line and gap-filled between the first dummy gates; and forming a first contact electrode vertically connected with the first gate line and a second contact electrode vertically connected with the second gate pad It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings.

Figure 1:
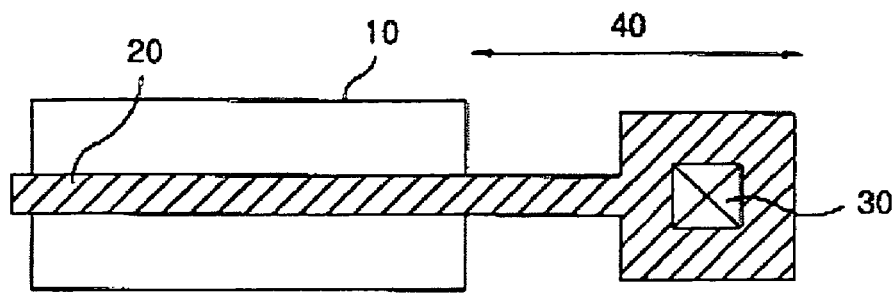
FIG. 1 is a plan view illustrating a general structure of a gate line of a semiconductor device.
Figure 2A:
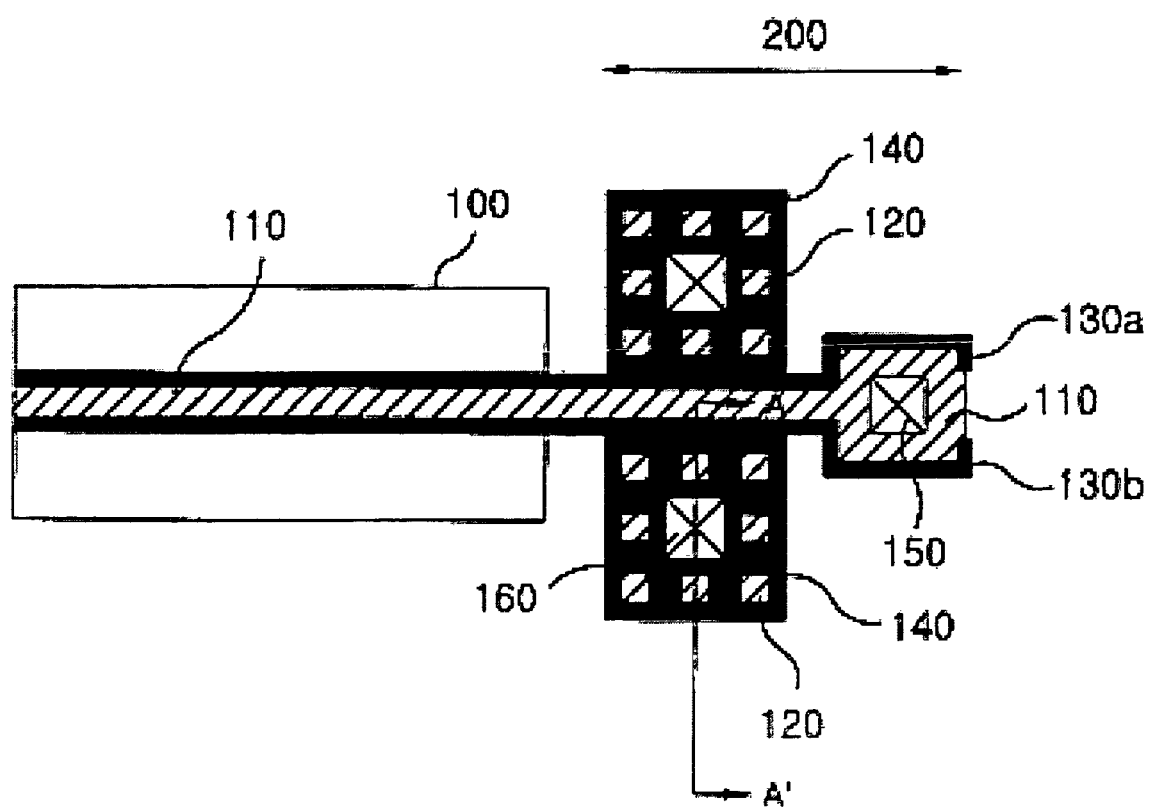
FIG. 2A is a plan view illustrating a structure of a semiconductor device according to an embodiment of the present invention.
Figure 2B:
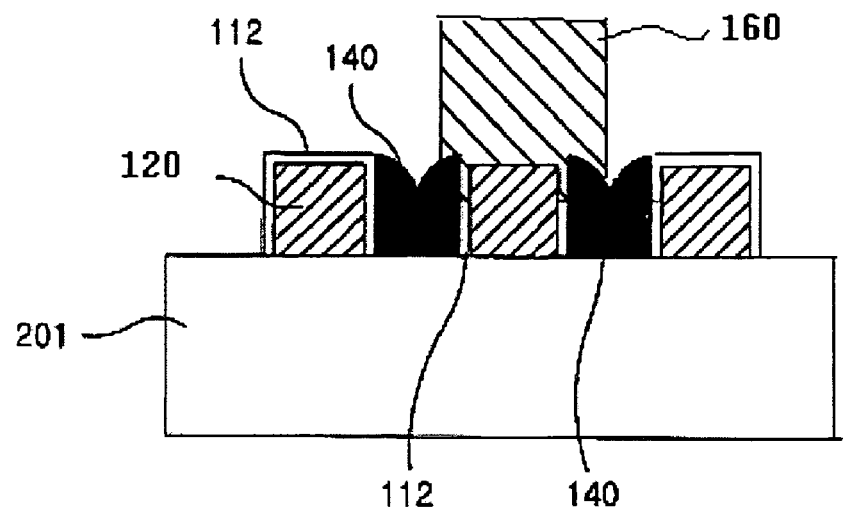
FIG. 2B is a cross-sectional view illustrating a structure of a semiconductor device according to an embodiment of the present invention.

FIG. 2A is a plan view illustrating a structure of a semiconductor device according to an embodiment of the present invention. FIG. 2B is an embodiment of a cross-sectional view taken along the line A-A' of FIG. 2A.

Referring to FIGS. 2A and 2B, a semiconductor device according to an embodiment of the present invention can incorporate a first gate line 110 formed in a linear shape in a cell region 100 and a peripheral circuit region 200 on a semiconductor substrate. Second gate lines 130a and 130b of a spacer shape can be formed with a thin insulating layer 112 interposed on sidewalls of the first gate line 110.

The second gate lines 130a and 130b can be formed as a single gate line on both sidewalls of the first gate line 110 and can be separated apart into two gate lines 130a and 130b. Therefore, second gate line 130a and second gate line 130b can perform separate functions.

A first contact electrode 150 can be vertically connected with an end portion of the first gate line 110 in the peripheral circuit region 200. In embodiments, the peripheral circuit region 200 can correspond to an outer edge of the semiconductor substrate.

A plurality of first dummy gates 120 and a second gate pad 140 can be formed on the semiconductor substrate. The plurality of first dummy gates 120 can be spaced a predetermined interval from the first gate line 110. The second gate pad 140 can be formed on the plurality of first dummy gates 120 with the thin insulating layer 112 interposed therebetween. The second gate pad 140 can connect with each of the second gate lines 130a and 130b, respectively, and can be gap-filled between the plurality of first dummy gates 120.

The first dummy gates 120 and the second gate pad 140 can be formed on a device isolation layer 201 in the peripheral circuit region 200. The first dummy gates 120 and second gate pad 140 can be used as a contact pad for the second gate lines 130a and 130b, respectively. The plurality of first dummy gates 120 can be formed in various patterns. In one embodiment, the plurality of first dummy gates 120 can be formed as an array of dummy gates 120 on each side of the gate line 110. The array of dummy gates 120 can be formed in, for example, a circular shape, a square shape, or a polygonal shape.

In a further embodiment, a second contact electrode 160 can be vertically connected with the second gate pad 140 and one or more dummy gates 120 to be electrically connected with the second gate line 130a. Another second contact electrode 160 can be vertically connected with the second gate pad 140 and one or more dummy gates 120 to be electrically connected with the second gate line 130b.

The first contact electrode 150 and the second contact electrodes 160 can be vertically connected with a power source line (not shown) for providing a predetermined voltage to the first gate line 110, the second gate line 130a, and the second gate line 130b. Embodiments of the subject invention can be incorporated in a memory device such as a DRAM.

The semiconductor device structure according to an embodiment of the present invention illustrated in FIGS. 2A and 2B shows a single first gate line 110, second gate lines 130a and 130b, first contact electrode 150, and second contact electrodes 160. In further embodiments, first gate line 110, second gate lines 130a and 130b, and contact electrodes 150 and 160 can be arranged in the form of a plurality of arrays of first gate line 110, second gate lines 130a and 130b, and contact electrodes 150 and 160.

Therefore, the semiconductor device according to an embodiment of the present invention can incorporate a first gate line 110 formed in the cell region 100 and the peripheral circuit region 200, second gate lines 130a and 130b of a spacer shape formed on the sidewalls of the first gate line 110, and first and second contact electrodes 150 and 160 independently connected with each of the gate lines. The first contact electrode 150 can be vertically connected with the first gate line 110, and the second contact electrodes 160 can be connected with the second gate lines 130a and 130b through the plurality of first dummy gates 120 and the second gate pad 140 horizontally connected with the second gate lines 130a and 130b, respectively.

Accordingly, the semiconductor device according to the present invention can provide an area for a contact electrode to connect with a spacer shaped gate line among adjacent gate lines by first dummy gates 120 and a second gate pad 140 although a critical dimension (CD) of the gate line is reduced according to the high integration.

FIGS. 3A to 3E are views illustrating a method of manufacturing a semiconductor device according to an embodiment of the present invention.

The semiconductor device and the manufacturing method thereof according to an embodiment of the present invention will now be described with reference to FIGS. 3A to 3E.

Figure 3A:
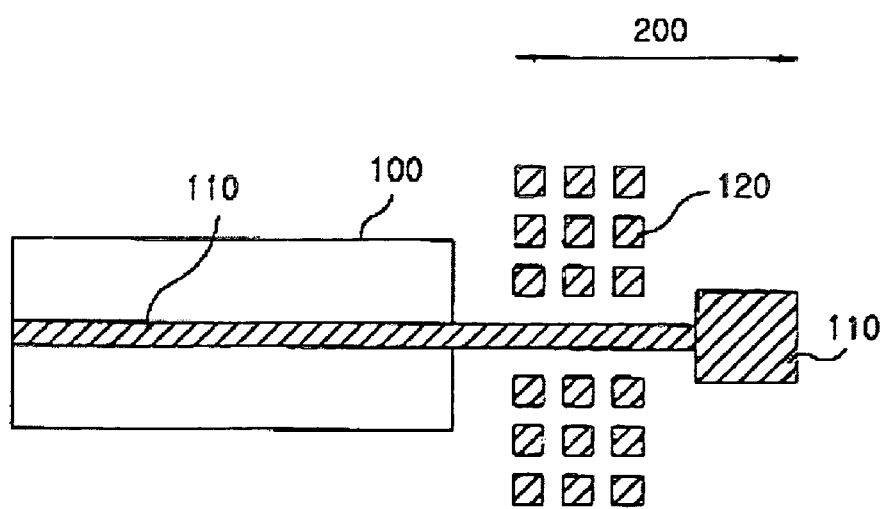
FIGS. 3A to 3E are views illustrating a semiconductor device and a manufacturing method thereof according to the present invention.

Referring to FIG. 3A, a device isolation layer (not shown) can be formed on a semiconductor substrate by a shallow trench isolation (STI) process to isolate an active region from an inactive region. In a specific embodiment, the semiconductor can be a silicon substrate. Next, a conductive layer can be formed in a cell region 100 and a peripheral circuit region 200 on the substrate. In one embodiment, the conductive layer can be a doped polysilicon layer. The conductive layer can be formed by a chemical vapor deposition (CVD) process, and then patterned to form a first gate line 110.

In an embodiment, the first gate line can have an end portion formed in the peripheral circuit region 200 that is wider than a width of the line. In particular, the end portion of the first gate line 110 can have a predetermined area for a contact with a first contact electrode 150 to be vertically connected with a line for receiving a voltage. A plurality of first dummy gates 120 can be formed in the peripheral circuit region 200 spaced at a predetermined interval from the gate line 110. The plurality of first dummy gates 120 can be formed as a pattern of dummy gates 120 in a circular shape, a square shape, or a polygonal shape adjacent the gate line 110.

In one embodiment, the first gate line 110 and the first dummy gates 120 can be formed simultaneously. In another embodiment, the first gate line 110 and the first dummy gates 120 can be formed sequentially.

In an embodiment, the first gate line 110 and the first dummy gates 120 can be formed of the same material.

Figure 3B:
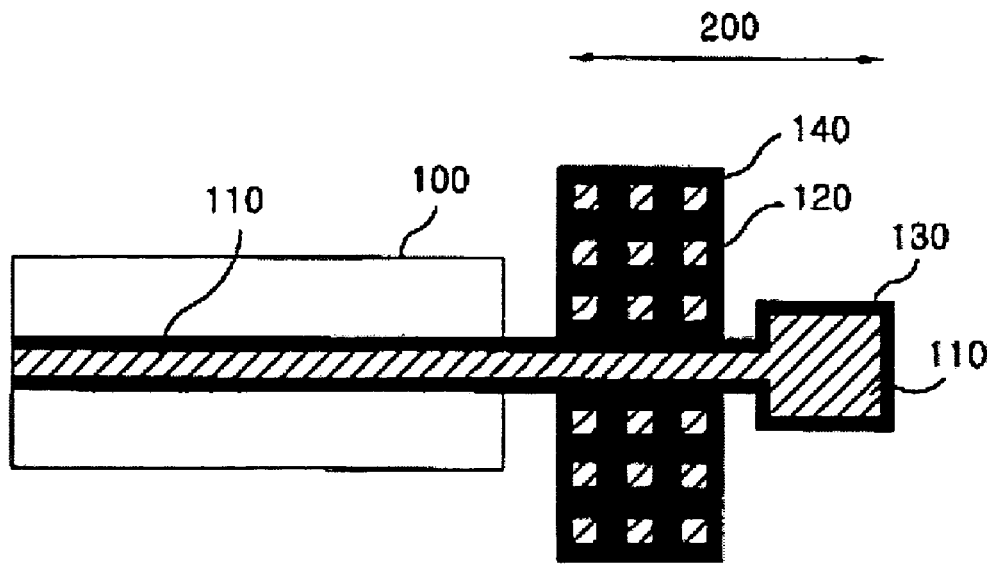
Figure 3C:
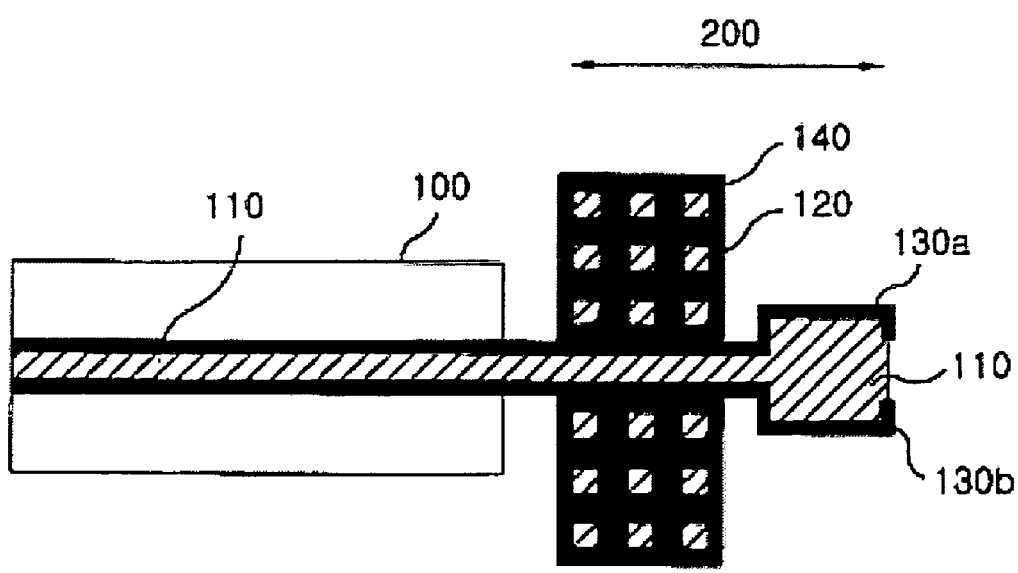
Figure 3D:
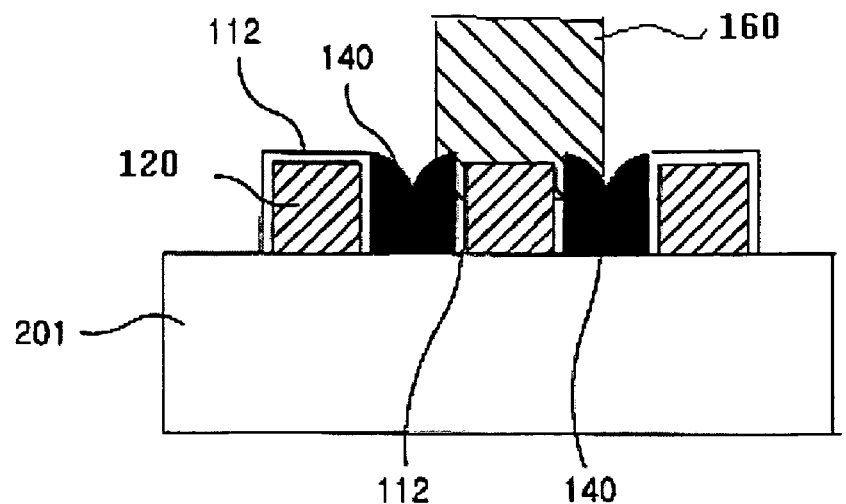

Referring to FIGS. 3B and 3D, a thin insulating layer 112 can be formed on the first gate line 110 and the first dummy gates 120. In a specific embodiment, the thin insulating layer 112 can be formed of silicon nitride (SiN). The insulating layer of silicon nitride can be formed by a CVD process or a physical vapor deposition (PVD) process.

Then, a second conductive layer can be deposited on the resulting structure. In a specific embodiment, the second conductive layer can be a doped polysilicon layer. The doped polysilicon layer can be dry-etched to form a second gate line 130 of a spacer shape on the thin insulating layer 112 on the sidewalls of the first gate line 110. In forming the second gate line 130, a second gate pad 140 horizontally connected with the second gate line 130 can be formed to gap-fill spaces between the first dummy gates 120.

In one embodiment, the second gate line 130 and the second gate pad 140 can be formed simultaneously. In another embodiment, the second gate line 130 and the second gate pad 140 can be formed sequentially.

In embodiments, the second gate line 130 and the second gate pad 140 can be formed of the same material.

Next, in a further embodiment as illustrated in FIG. 3C, the second gate line formed at the end portion of the first gate line 110 corresponding to a contact region can be selectively etched to separate second gate line 130 into second gate lines 130a and 130b separated from each other in the end portion of the first gate line 110.

That is, the second gate lines 130a and 130b can be formed on both sides of the first gate line 110, and can be electrically separated from each other. Accordingly, second gate line 130a and second gate line 130b can perform separate functions.

Figure 3E:
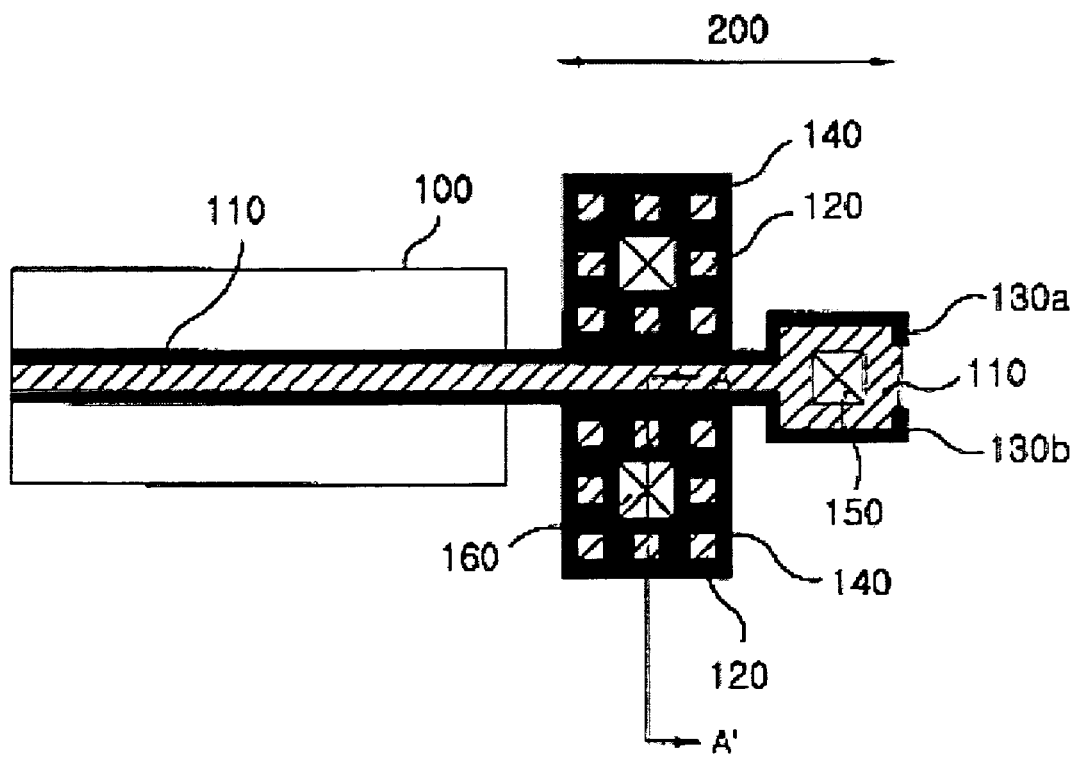

Next, as illustrated in FIGS. 3D and 3E, a third conductive layer can be deposited in the peripheral circuit region 200 on the substrate, and can be etched by a dry etching process to form a first contact electrode 150 vertically connected with the end portion of the first gate line 110. Simultaneously, second contact electrodes 160 can be formed vertically connected with one or more dummy gates 120 and a portion of the second gate pad 140 such that the second contact electrodes 160 can be electrically connected with second gate lines 130a and 130b, respectively. In a specific embodiment, the third conductive layer can be doped polysilicon. In another specific embodiment, the third conductive layer can be tungsten.

In an embodiment, the thin insulating layer 112 in a predetermined second contact region on the one or more first dummy gates 120 can be removed before forming the second contact electrode 160.

As illustrated above, the semiconductor device according to the present invention can incorporate gate lines of a spacer shape formed on a sidewall of a first gate line having a thin insulating layer interposed therebetween, and contact electrodes electrically connected with each of the gate lines having different critical dimensions. Therefore, a contact electrode region can be obtained so as to provide sufficient voltage even to a gate line of a spacer shape having a reduced critical dimension according to the high integration of the semiconductor device.

It will be apparent to those skilled in the art that various modifications and variations can be made in the present invention. Thus, it is intended that the present invention covers the modifications and variations of this invention provided they come within the scope of the appended claims and their equivalents.

I claim:

1. A method of manufacturing a semiconductor device, the method comprising:
    forming a first gate line, first dummy gates spaced a predetermined interval from a first side of the first gate line, and second dummy gates spaced a predetermined interval from a second side of the first gate line on a semiconductor substrate;
    forming a thin insulating layer on the first gate line, the first dummy gates, and the second dummy gates;
    forming a second gate line of a spacer shape on the thin insulating layer on the sidewalls of the first gate line;
    forming a second gate pad of a spacer shape connected with the second gate line at the first side of the first gate line, wherein the second gate pad fills gaps between the first dummy gates;
    forming a third gate pad of spacer shape connected with the second gate line at the second side of the first gate line, wherein the third gate pad fills gaps between the second dummy gates; and
    forming a first contact electrode vertically connected with the first gate line, a second contact electrode vertically connected with one or more of the first dummy gates and the second gate pad, and a third contact electrode vertically connected with one or more of the second dummy gates and the third gate pad.

2. The method according to claim 1, further comprising, after forming the second gate line, removing a predetermined portion of the second gate line to electrically separate the second gate line into two separate gate lines.

3. The method according to claim 1, wherein forming the first dummy gates comprises forming a plurality of first dummy gates separated from each other in a first pattern; and
    forming the second dummy gates comprises forming a plurality of second dummy gates separated from each other in a second pattern.

4. The method according to claim 1, wherein the first pattern and the second pattern is a circular shape, a square shape, or a polygonal shape.

5. The method according to claim 1, wherein the first dummy gates, the second dummy gates, the second gate pad, and the third gate pad are formed on an outer edge of the semiconductor substrate.

6. The method according to claim 5, wherein the first dummy gates, the second dummy gates, the second gate pad, and the third gate pad are formed on a device isolation layer in the edge of the semiconductor substrate.

7. The method according to claim 1, wherein the first gate line, the first dummy gates, and the second dummy gates are simultaneously formed.

8. The method according to claim 1, wherein the second gate line, the second gate pad, and the third gate pad are simultaneously formed.

9. The method according to claim 1, wherein forming the second gate line, forming the second gate pad, and forming the third gate pad comprises depositing a conductive material and dry-etching the conductive material.

10. The method according to claim 9, wherein dry-etching the conductive material does not expose the substrate between the first dummy gates and dry-etching the conductive material does not expose the substrate between the second dummy gates.

11. The method according to claim 1, further comprising, before forming the second contact electrode and forming the third contact electrode, removing the thin insulating layer in a predetermined second contact region on the first dummy gates and the second gate pad and in a predetermined third contact region on the second dummy gates and the third gate pad.

12. The method according to claim 1, wherein the first gate line, the first dummy gates, and the second dummy gates are formed of the same material.

13. The method according to claim 1, wherein the second gate line, the second gate pad, and the third gate pad are formed of the same material.

* * * * *